(12) United States Patent
Li et al.

(10) Patent No.: US 10,019,089 B2
(45) Date of Patent: Jul. 10, 2018

(54) TOUCH SUBSTRATE, METHOD FOR MANUFACTURING THE SAME, AND TOUCH DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jun Li, Beijing (CN); Xianlin Ding, Beijing (CN); Guiyu Zhang, Beijing (CN); Ting Zeng, Beijing (CN); Jun Chen, Beijing (CN); Qingpu Wang, Beijing (CN); Hongqiang Luo, Beijing (CN); Kefeng Li, Beijing (CN); Qicheng Chen, Beijing (CN); Zhi Du, Beijing (CN); Zhanqi Xu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 45 days.

(21) Appl. No.: 15/083,447

(22) Filed: Mar. 29, 2016

(65) Prior Publication Data

US 2017/0031486 A1 Feb. 2, 2017

(30) Foreign Application Priority Data

Jul. 31, 2015 (CN) .......................... 2015 1 0470516

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H05K 1/0296* (2013.01); *H05K 1/115* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,815,646 B2 * | 8/2014 | Ohno | ............... C23C 24/04 257/672 |
| 2012/0127099 A1 * | 5/2012 | Liu | ............... G06F 3/044 345/173 |
| 2014/0085235 A1 * | 3/2014 | Tokita | ............... G06F 3/0412 345/173 |

FOREIGN PATENT DOCUMENTS

| | | |
|---|---|---|
| CN | 202351840 U | 7/2012 |
| CN | 104636005 A | 5/2015 |
| KR | 10-2014-0004887 A | 1/2014 |

OTHER PUBLICATIONS

CN 201310729390 Chen Shizheng Dec. 25, 2013 (Year: 2013).*
First Office Action dated Aug. 1, 2017 in corresponding Chinese Patent Application No. 201510470516.7.

* cited by examiner

*Primary Examiner* — Van N Chow
(74) *Attorney, Agent, or Firm* — Nath, Goldberg & Meyer; Joshua B. Goldberg

(57) ABSTRACT

The present invention provides a touch substrate, comprising a plurality of first electrodes extending along a first direction and a plurality of second electrodes extending along a second direction intersecting with the first direction, wherein the first electrode comprises a plurality of first electrode blocks, the second electrode comprises a plurality of second electrode blocks, adjacent two first electrode (Continued)

A-A blocks are connected via at least one electrically conductive connecting piece, adjacent two second electrode blocks are formed integrally; a connecting piece comprises two contact portions and a connecting portion, the insulating layer at least covers each connecting piece and exceeds border of the connecting piece, the first electrode block is electrically connected to the contact portion via a via hole passing through the insulating layer, and a part of the contact portion is not exposed by the via hole.

20 Claims, 4 Drawing Sheets

(51) Int. Cl.
| | |
|---|---|
| *H05K 1/02* | (2006.01) |
| *H05K 1/11* | (2006.01) |
| *H05K 3/46* | (2006.01) |
| *H05K 3/00* | (2006.01) |
| *H05K 3/10* | (2006.01) |

(52) U.S. Cl.
CPC ............ *H05K 3/0011* (2013.01); *H05K 3/10* (2013.01); *H05K 3/4644* (2013.01); *G06F 2203/04103* (2013.01); *G06F 2203/04111* (2013.01); *H05K 2201/0108* (2013.01)

A-A

US 10,019,089 B2

TOUCH SUBSTRATE, METHOD FOR MANUFACTURING THE SAME, AND TOUCH DISPLAY APPARATUS

FIELD OF THE INVENTION

The present invention relates to the field of display technology, and particularly relates to a touch substrate, a method for manufacturing the same, and a touch display apparatus comprising the touch substrate.

BACKGROUND OF THE INVENTION

A one glass solution (OGS) touch screen has become a new prospective trend of the touch screen industry due to its characteristics like simple structure, light weight, thinness, and good light transmission. A touch screen comprises a plurality of first electrodes and a plurality of second electrodes, and an extending direction of the first electrodes intersects with that of the second electrodes. The first electrode comprises a plurality of first electrode blocks, and the second electrode comprises a plurality of second electrode blocks. Currently, the first electrode blocks and the second electrode blocks are usually fabricated first, wherein adjacent two second electrode blocks are directly connected, while adjacent two first electrode blocks are bridged by using a connecting piece. In order to insulate and separate the second electrodes from the connecting piece and prevent oxidization of the connecting piece due to long-term contact with air during a process, insulating layers will be formed before and after forming the connecting piece, respectively, which results in a relatively complex structure of the touch screen.

SUMMARY OF THE INVENTION

An objective of the present invention is to provide a touch substrate, a method for manufacturing the same, and a touch display apparatus, so as to simplify the structure of the touch substrate and meanwhile ensure quality of the touch substrate.

In order to achieve the above objective, the present invention provides a touch substrate, comprising: a plurality of first electrodes extending along a first direction and a plurality of second electrodes extending along a second direction that intersects with the first direction, wherein the first electrode comprises a plurality of first electrode blocks, the second electrode comprises a plurality of second electrode blocks, adjacent two first electrode blocks are connected via at least one electrically conductive connecting piece, adjacent two second electrode blocks are formed integrally, and an insulating layer is disposed between a layer where the first electrodes and the second electrodes are located and the connecting piece to insulate and separate the second electrodes from the connecting pieces; each connecting piece comprises two contact portions and a connecting portion connected between the two contact portions, the two contact portions are electrically connected to the first electrode blocks at two ends of the connecting portion, respectively, the insulating layer at least covers each connecting piece and exceeds border of the connecting piece, and the first electrode block is electrically connected to the contact portion via a via hole passing through the insulating layer.

Preferably, the contact portion comprises a middle area and a plurality of edge areas surrounding the middle area, wherein each of the edge areas comprises one edge of the contact portion, and the via hole exposes no more than two edge areas in the plurality of edge areas, so that the number of the edge areas in contact with the first electrode block is less than or equal to two.

Preferably, the plurality of edge areas include a first edge area, a second edge area, a third edge area, and a fourth edge area, wherein the first edge area is disposed between the middle area and the connecting portion, and the first edge area and any one of the other three edge areas are not exposed by the via hole.

Preferably, the plurality of edge areas include a first edge area, a second edge area, a third edge area, and a fourth edge area, wherein the first edge area is disposed between the middle area and the connecting portion, and the first edge area and any two of the other three edge areas are not exposed by the via hole.

Preferably, an orthographic projection of the via hole on the contact portion is in the middle area.

Preferably, the touch substrate comprises a touch area for touch and a non-touch area surrounding the touch area, and the insulating layer covers the touch area.

Preferably, a size of the contact portion along the second direction is greater than or equal to that of the connecting portion in the second direction.

Preferably, material for forming the connecting piece is a metal.

Preferably, material for forming the insulating layer is a photoresist.

Preferably, adjacent two first electrode blocks in a same first electrode are connected through two connecting pieces.

Preferably, the first electrode block is electrically connected to two contact portions via one via hole.

Preferably, the touch substrate further comprises a black matrix disposed in the non-touch area.

Correspondingly, the present invention further provides a method for manufacturing a touch substrate, comprising steps of:

forming an electrically conductive connecting piece, wherein the connecting piece comprises two contact portions and a connecting part disposed between the two contact portions;

forming an insulating layer such that the insulating layer at least covers each connecting piece and exceeds border of the connecting piece;

forming a via hole passing through the insulating layer, wherein the via hole is disposed above the contact portion, and exposes only a part of edges of the contact portion; and forming a plurality of first electrodes extending along a first direction and a plurality of second electrodes extending along a second direction, wherein the first direction intersects with the second direction, the first electrode comprises a plurality of first electrode blocks, the second electrode comprises a plurality of second electrode blocks formed integrally, adjacent two first electrode blocks are connected through at least one connecting piece, and the first electrode block is electrically connected to the contact portion via the via hole.

Preferably, the contact portion comprises a middle area and a plurality of edge areas surrounding the middle area, wherein each of the edge areas includes one edge of the contact portion, and the step of forming a via hole passing through the insulating layer comprises:

performing a patterning process on the insulating layer to remove a part, in a predetermined area, of the insulating layer to form the via hole, such that the number of the edge areas exposed by the via hole is less than or equal to two.

Preferably, the plurality of edge areas include a first edge area, a second edge area, a third edge area, and a fourth edge area, wherein the first edge area is disposed between the middle area and the connecting portion, and in the step of performing a patterning process on the insulating layer, the first edge area and any one of the other three edge areas are not exposed by the via hole.

Preferably, the plurality of edge areas include a first edge area, a second edge area, a third edge area, and a fourth edge area, wherein the first edge area is disposed between the middle area and the connecting portion, and in the step of performing a patterning process on the insulating layer, the first edge area and any two of the other three edge areas are not exposed by the via hole.

Preferably, in the step of performing a patterning process on the insulating layer, an orthographic projection of the predetermined area on the contact portion is in the middle area.

Preferably, the touch substrate comprises a touch area for touch and a non-touch area surrounding the touch area, and in the step of forming an insulating layer, the insulating layer covers the touch area.

Preferably, a size of the contact portion along the second direction is greater than or equal to that of the connecting portion in the second direction.

Preferably, the step of forming an electrically conductive connecting piece comprises:
forming a metal layer, and
performing a patterning process on the metal layer to form a pattern including the connecting piece.

Preferably, material for forming the insulating layer is a photoresist, and the step of performing a patterning process on the insulating layer comprises exposing and developing the insulating layer.

Preferably, adjacent two first electrode blocks in a same first electrode are connected through two connecting pieces.

Preferably, the first electrode block is able to be electrically connected to two contact portions via one via hole.

Preferably, the method further comprises, before the step of forming an electrically conductive connecting piece, a step of:
forming a black matrix in the non-contact area.

Correspondingly, the present invention further provides a touch display apparatus comprising the touch substrate provided by the present invention.

In the present invention, a connecting piece may be formed first, and it is only required to form one insulating layer after the connecting piece is formed, which simplifies structure of the touch substrate. Besides, the insulating layer covers the connecting piece and exceeds the border of the connecting piece, the first electrode block is electrically connected to the contact portion through a via hole in the insulating layer, and additionally, a part of the contact portion is not exposed by the via hole but covered by the insulating layer, therefore, the first electrode blocks will not climb from the border of the part, thereby lowering the possibility of rupture of the first electrode blocks. As a result, the structure of the touch substrate is simplified, and product quality is ensured.

BRIEF DESCRIPTION OF THE DRAWINGS

The accompanying drawings, which constitute a part of the specification, provide further understanding of the present invention, and are used for explaining the present invention together with the following specific implementations, rather than limiting the present invention. In the accompanying drawings.

Figure 1:
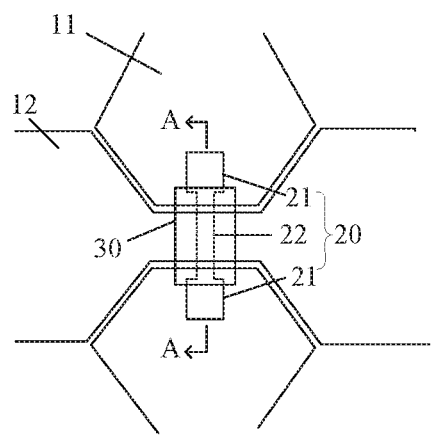
FIG. 1 is a top view illustrating a case in which a relatively small area of a connecting piece is covered by an insulating layer in the present invention.

Reference numerals: 11. First electrode block; 12. Second electrode block; 20. Connecting piece; 21. Contact portion; 21*a*. First edge area; 21*b*. Second edge area; 21*c*. Third edge area; 21*d*. Fourth edge area; 21*e*. Middle area; 22. Connecting portion; 30. Insulating layer.

DESCRIPTION OF THE PREFERRED EMBODIMENT

Specific implementations of the present invention will be described in detail below with reference to the accompanying drawings. It should be understood that the specific implementations described here are only for illustrating and explaining the present invention, and are not intended to limit the present invention.

Figure 5:
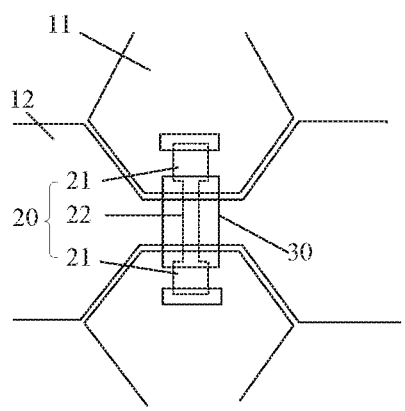
FIG. 5 is a schematic diagram of a first structure of an insulating layer formed with a via hole in the present invention.

According to one aspect of the present invention, there is provided a touch substrate, comprising a plurality of first electrodes extending along a first direction and a plurality of second electrodes extending along a second direction that intersects with the first direction, wherein the first electrode comprises a plurality of first electrode blocks, the second electrode comprises a plurality of second electrode blocks, as shown in FIGS. 1 and 5, adjacent two first electrode blocks 11 are connected via at least one electrically conductive connecting piece 20, adjacent two second electrode blocks 12 are formed integrally, and an insulating layer 30 is disposed above the connecting piece 20 to insulate and separate the second electrodes from the connecting piece 20; the connecting piece 20 comprises two contact portions 21 and a connecting portion 22 connected between the two contact portions 21, the two contact portions 21 are electrically connected to the first electrode blocks 11 at two ends of the connecting portion 22, respectively, the insulating layer 30 at least covers each connecting piece 20 and exceeds border of the connecting piece 20, the first electrode block 11 is electrically connected to the contact portion 21 via a via hole passing through the insulating layer 30, and a part of the contact portion 21 is not exposed by the via hole. It can be understood that the part of the contact portion 21 which is not exposed by the via hole is covered by the insulating layer.

In the present invention, the insulating layer 30 is disposed on the connecting piece 20, and the insulating layer 30 can insulate and separate the connecting piece 20 from the second electrodes while protecting the connecting piece 20. Therefore, in manufacturing the touch substrate, before fabricating the first and second electrodes, a connecting piece may be first formed, and then only one insulating layer 30 needs to be formed, which simplifies the structure of the touch substrate.

Figure 2:
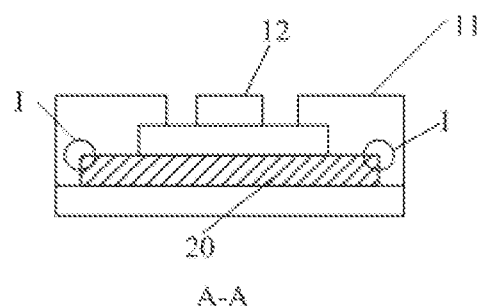
FIG. 2 is a cross-sectional view taken along line A-A in FIG. 1.
Figure 3:
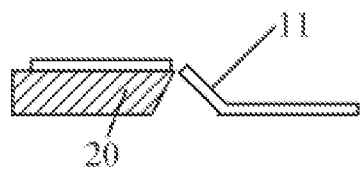
FIG. 3 is a schematic diagram of a rupture occurring to a first electrode block in Area I in FIG. 2.

It can be understood that if the area of the connecting piece 20 covered by the insulating layer 30 is relatively small, as shown in FIGS. 1 and 2, the first electrode block may climb towards the contact portion from the boarder of the contact portion 21 when forming the first electrode block. The connecting piece 20 is generally made of metal, and as different areas of the connecting piece 20 have different reaction speeds to an etchant when etching the metal, an undercut phenomenon is likely to occur, i.e., the connecting piece is divided into three layers, namely, upper layer, middle layer, and lower layer, along its thickness direction, the cross-sectional areas of the upper layer and lower layer are relatively large, whereas the cross-sectional area of the middle layer is relatively small. As a result, when the first electrode block climbs towards the contact portion 21, rupture is likely to occur, as shown in FIG. 3, which results in defects in product and lowers the anti-static performance of the product.

However, in the present invention, the insulating layer 30 covers the connecting piece and exceeds the border of the connecting piece, the first electrode block is electrically connected to the contact portion through the via hole in the insulating layer; moreover, a part of the contact portion is not exposed by the via, and the part exceeding the via hole is covered by the insulating layer and is not exposed. In this way, the first electrode block cannot climb from the border of that part, thereby lowering the possibility of rupture of the first electrode block and ensuring quality and anti-static performance of the product. Therefore, the present invention may simplify the structure of the touch substrate and meanwhile ensures quality of the product.

Border of the connecting piece includes borders of the contact portions 21 and border of the connecting part 22. The border of the connecting part 22 is covered by the insulating layer such that the second electrode block 12 cannot climb at the border of the connecting portion 22, thereby lowering the possibility of rupture of the second electrode block 12.

The present invention does not limit which parts of the contact portion 21 are not exposed by the via hole. Specifically, the contact portion 21 includes a middle area in the middle of the contact portion 21 and a plurality of edge areas surrounding the middle area, each edge area includes an edge of the contact portion, and at least one edge area is not exposed by the via, so that the number of the edge areas contacting the first electrode block is less than or equal to two. Therefore, the first electrode block climbs from at most two edges of the contact portion towards the contact portion, and compared with the structure in which the first electrode 11 climbs from three edges of the contact portion shown in FIG. 1, the possibility of rupture of the first electrode block is lowered.

The number of the edge areas may correspond to that of edges of the contact portion. For example, if the surface of the contact portion 21 towards the first electrode block is a quadrangle, the contact portion 21 correspondingly includes four edge areas; alternatively, if the surface of the contact portion 21 towards the first electrode block is a pentagon, the contact portion 21 correspondingly includes five edge areas. In order to lower the possibility of rupture of the first electrode block 11, the number of the exposed edges of the contact should be as less as possible.

In the present invention, the material for forming the connecting piece 20 comprises metal, such as copper, aluminum, etc. The first electrode blocks 11 and the second electrode blocks 12 may be made of indium tin oxide. It should be understood that in a case in which the insulating layer 30 exceeds the border of the connecting piece 20, when forming the first electrode block 11, the indium tin oxide layer may climb at the border of the insulating layer instead of the boarder of the connecting piece. Because the insulating layer may be made relatively thin and the border of the insulating layer may be formed with a certain slope angle when a patterning process is performed to form the pattern of the insulating layer, which facilitates climbing of the indium tin oxide, and will not cause rupture of the first electrode block or the second electrode block.

Figure 4:
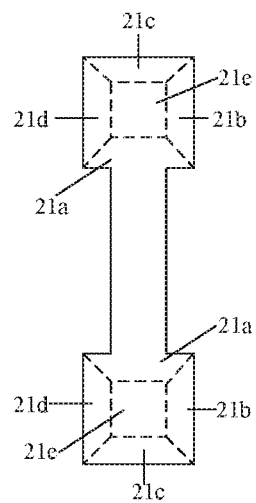
FIG. 4 is a schematic structural diagram of a connecting piece in the present invention.

As a specific implementation of the present invention, as shown in FIG. 4, the plurality of edge areas include a first edge area 21a, a second edge area 21b, a third edge area 21c, and a fourth edge area 21d, wherein the first edge area 21a is positioned between the middle area 21e and the connecting portion 22. As shown in FIG. 5, the first edge area 21a and any one of the other three edge areas are not exposed by the via hole. That is, the insulating layer 30 covers the first edge area 21a and any one of the other three edge areas.

In the present invention, the via hole is not necessarily an enclosed via hole, and may be a semi-enclosed via hole. As shown in FIG. 5, the first edge area and the third edge area are not exposed by the via hole, and are covered by the insulating layer 30; alternatively, as shown in FIG. 6, the first edge area and the second edge area are not exposed by the via hole, and are covered by the insulating layer 30, alternatively, as shown in FIG. 7, in two contact portions 21 for adjacent two first electrode blocks, the insulating layer 30 covers the first edge area and the second edge area of one contact portion 21, and also covers the first edge area and the fourth edge area of the other contact portion 21.

Figure 6:
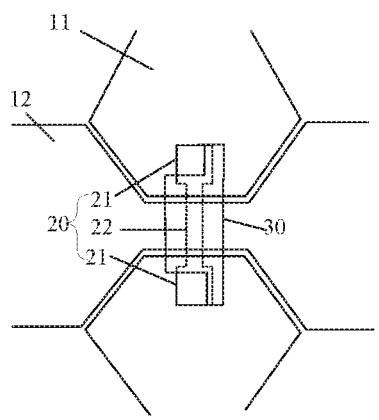
FIG. 6 is a schematic diagram of a second structure of an insulating layer formed with a via hole in the present invention.
Figure 7:
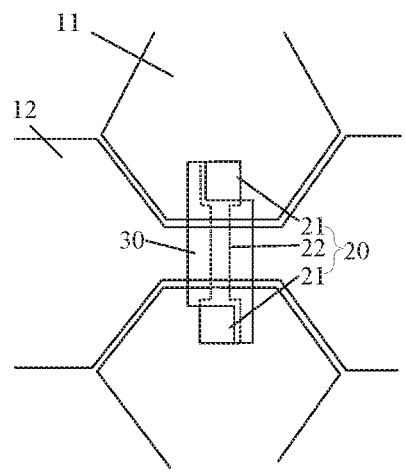
FIG. 7 is a schematic diagram of a third structure of an insulating layer formed with a via hole in the present invention.

In the implementations shown in FIGS. 5 to 7, the first electrode block 11 climbs at two edges of the contact portion. Compared with the structure in which the first electrode block climbs at three edges of the contact portion, the possibility of rupture of the first electrode block is reduced.

Figure 8:
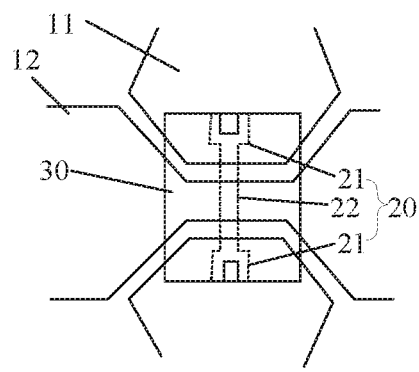
FIG. 8 is a schematic diagram of a fourth structure of an insulating layer formed with a via hole in the present invention.

According to another implementation of the present invention, as shown in FIG. 4, the plurality of edge areas include a first edge area 21a, a second edge area 21b, a third edge area 21c, and a fourth edge area 21d, wherein the first edge area 21a is disposed between the middle area 21e and the connecting portion 22. As shown in FIG. 8, the first edge area 21a and any two of the other three edge areas are not exposed by the via hole. That is, the first edge area 21a and any two of the other three edge areas are covered by the insulating layer 30.

As shown in FIG. 8, the insulating layer covers the first edge area of the contact portion, the second and fourth edge areas that are adjacent to the first edge area. In this way, only one edge of the contact portion 21 contacts the first electrode block 11. Compared with the manner in FIG. 1 where the first electrode block 11 climbs at three edges of the connecting piece, the possibility of rupture of the first electrode block 11 is lowered.

Figure 9:
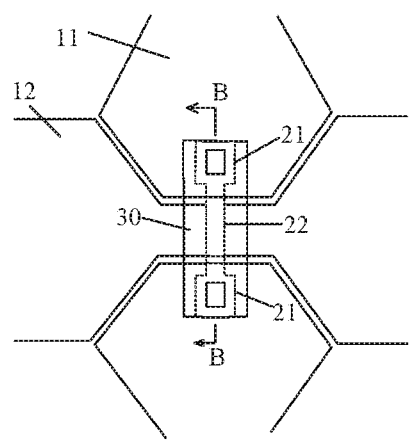
FIG. 9 is a schematic diagram of a fifth structure of an insulating layer formed with a via hole in the present invention.
Figure 10:
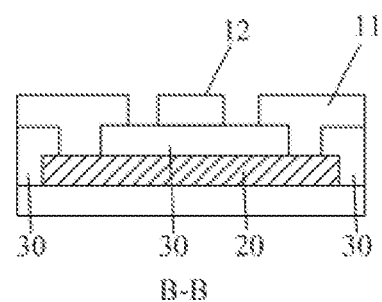
FIG. 10 is a cross-sectional view taken along line B-B in FIG. 9.

Preferably, as shown in FIGS. 9 and 10, an orthographic projection of the via hole on the contact portion 21 is in the middle area of the contact portion 21. In this way, all of the edge portions 21 are covered by the insulating layer 30, such that the first electrode block will not directly climb at the edges of the connecting piece, thereby lowering the possibility of rupture of the first electrode block 11 at the border of the connecting piece. As shown in FIG. 9, the insulating layer does not cover an area outside the connecting piece, e.g., the area of the second electrode block; alternatively, the touch substrate comprises a touch area for touch and a non-touch area surrounding the touch area, and the insulating layer 30 covers the touch area. By forming a via hole at a position of the insulating layer corresponding to each contact portion 21, the first electrode block 11 is connected to the contact portion 21 via the via hole.

Specifically, a size of the contact portion 21 in the second direction is larger than or equal to that the connecting portion 22 in the second direction. As shown in FIG. 4, the size of the contact portion 21 in the second direction is greater than that of the connecting portion 22 in the second direction. When the area of the contact portion 21 is relatively large, the via hole may be formed with a relatively large size, thereby lowering the requirements on the process and material resolution, which facilitates formation of the via hole.

In order not to affect display effect, the insulating layer may be made of a transparent insulating material.

Specifically, material for forming the insulating layer may be a photoresist. When forming an insulating layer with a via hole, a photoresist layer is first formed on the substrate formed with a connecting piece, and then it is only needed to expose and develop the photoresist layer. In this way, the process is relatively simple, besides, during the exposure process, the closer the photoresist is to the substrate along a thickness direction of the photoresist layer, the lower the degree of exposure of the photoresist is; therefore, after development, a certain slope angle is formed at the border of the photoresist layer, which facilitates climbing of the subsequently formed indium tin oxide layer towards the photoresist layer.

Figure 11:
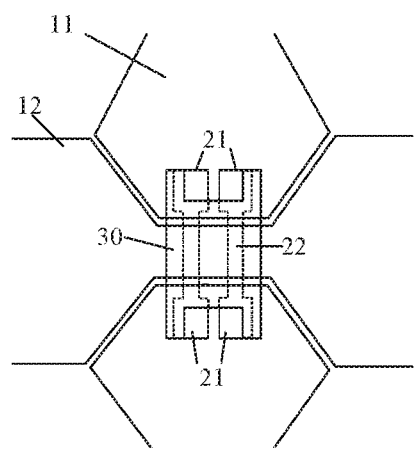
FIG. 11 is a schematic diagram of a sixth structure of an insulating layer formed with a via hole in the present invention.

Preferably, as shown in FIG. 11, adjacent two first electrode blocks in the same first electrode are connected through two connecting pieces so as to enhance reliability of the connection between the adjacent two first electrode blocks. In each implementation in FIGS. 5 and 9, adjacent two first electrodes may be connected by using two connecting pieces.

Further preferably, when adjacent two first electrode blocks in the same first electrode are connected through two connecting pieces, each via hole may correspond to two contact portions 21, so that the first electrode block 11 can be electrically connected to the two contact portions 21 via one via hole. In this way, the via hole may be made large, and the requirements on the process and material resolution are lowered.

Further specifically, the touch substrate further comprises a black matrix located in the non-touch area. In a touch display apparatus comprising the touch substrate, when a backlight source emits light towards the touch substrate to display a picture, the black matrix can prevent light leakage at a periphery of the touch substrate. Moreover, the touch display device further comprises a drive circuit, etc., the non-touch area of the touch substrate is provided with a lead wire connected to the drive circuit, and the black matrix may block the lead wire.

According to another aspect of the present invention, there is provided a method for manufacturing a touch substrate, comprising steps of:
    forming an electrically conductive connecting piece, wherein the connecting piece comprises contact portions and a connecting part disposed between two contact portions;
    forming an insulating layer such that the insulating layer at least covers each connecting piece and exceeds border of the connecting piece;
    forming a via hole passing through the insulating layer, wherein the via hole is disposed above the contact portion, and exposes only a part of the contact portion;
    forming a plurality of first electrodes extending along a first direction and a plurality of second electrodes extending along a second direction, wherein the first direction intersects with the second direction, the first electrode comprises a plurality of first electrode blocks, the second electrode comprises a plurality of second electrode blocks formed integrally, adjacent two first electrode blocks are connected via at least one connecting piece, and the first electrode block is electrically connected to the contact portion via the via hole.

The step of forming the connecting piece is performed before forming the first electrodes and the second electrodes, and therefore, it is unnecessary to form an insulating layer before forming the connecting piece, which simplifies the structure of the touch substrate as well as the process procedure. Because the insulating layer covers the connecting piece and exceeds the border of the connecting piece, the first electrode block may be connected to the contact portion through the via hole, thereby decreasing occurrence of the scenario that the first electrode block directly climbs at edges of the contact portion. As a result, the possibility of rupture of the first electrode block at edges of the contact portion may be lowered, and the product quality is ensured while the structure of the touch substrate is simplified.

Specifically, as described above, the contact portion comprises a middle area and a plurality of edge areas surrounding the middle area, and correspondingly, the step of forming a via hole passing through the insulating layer comprises:
    performing a patterning process on the insulating layer to remove a part in a predetermined area of the insulating layer, so as to form the via hole, wherein at least one edge area is not exposed by the predetermined area, so that the number of the edge areas that are exposed by the via hole is less than or equal to two. In this way, when subsequently forming a first electrode block, the first electrode block climbs from at most two edges of the contact portion, which reduces the possibility of rupture of the first electrode block.

As an specific implementation of the present invention, the plurality of edge areas include a first edge area, a second edge area, a third edge area, and a fourth edge area, wherein the first edge area is disposed between the middle area and the connecting portion. In the step of performing a patterning process on the insulating layer, the first edge area and any one of the other three edge areas are not exposed by the predetermined area, so that two edges of the contact portion are covered by the insulating layer.

An orthographic projection of the predetermined area on the contact portion at least covers the middle area. As shown in FIG. 5, the orthographic projection of the predetermined area on the contact portion covers the middle area, the second edge area and the fourth edge area, but the first edge area and the third edge area are not exposed by the predetermined area.

As another specific implementation of the present invention, as described above, the plurality of edge areas include a first edge area, a second edge area, a third edge area, and a fourth edge area, wherein the first edge area is disposed between the middle area and the connecting portion. In the step of performing a patterning process on the insulating layer, the first edge area and any two of the other three edge areas are not exposed by the predetermined area. As shown in FIG. 8, the orthographic projection of the predetermined area on the contact portion covers the middle area and the third edge area, whereas the first edge area, the second edge area, and the fourth edge area are not exposed by the predetermined area, so that three edges of the contact portion are covered by the insulating layer.

As still another specific implementation of the present invention, in the step of performing a patterning process on the insulating layer, the orthographic projection of the predetermined area on the contact portion is in the middle area, so that all edges of the contact portion are covered by the insulating layer, and an indium tin oxide layer will not climb at the edges of the connecting piece when subsequently forming the first electrode block, which greatly reduces the possibility of rupture of the first electrode block.

The touch substrate comprises a touch area for touch and a non-touch area surrounding the touch area, and in the step of forming an insulating layer, the insulating layer covers the touch area, and then a via hole is formed at a position of the insulating layer corresponding to each contact portion, such that the first electrode block is electrically connected to the contact portion via the via hole.

In order to facilitate formation of the via hole, a size of the contact portion along the second direction is greater than or equal to that of the connecting portion in the second direction, so that the area of the contact portion is relatively large, and a relatively large via hole may be formed.

As described above, material for forming the connecting piece is a metal, and correspondingly, the step of forming an electrically conductive connecting piece comprises:

forming a metal layer; and performing a patterning process on the metal layer to form a pattern including the connecting piece. The patterning process performed on the metal layer comprises: firstly, forming a photoresist layer on the metal layer, then exposing and developing the photoresist layer, so as to maintain the photoresist corresponding to the position of the connecting piece and remove the photoresist in other area, etching off the portion of the metal layer not covered by the photoresist by using an etchant, and finally stripping off the remaining photoresist, thereby forming the connecting piece.

Preferably, material for forming the connecting piece is a photoresist, and the step of performing a patterning process on the insulating layer comprises exposing and developing the insulating layer, thereby simplifying the process of forming the via hole.

Here, the photoresist may be a positive photoresist or a negative photoresist. In a case in which the photoresist is a positive photoresist, a light-transmissive area of a mask plate corresponds to the predetermined area, so that the photoresist in the predetermined area can be dissolved in a developing solution after being exposed so as to be removed by the developing solution, and as a result, a via hole is formed to electrically connect the first electrode block to the contact portion. In a case in which the photoresist is a negative photoresist, a non-light-transmissive area of the mask plate corresponds to the predetermined area, so that the photoresist in the predetermined area is dissolved in the developing solution to be removed, and as a result, the via hole is formed to electrically connect the first electrode block to the contact portion.

As described above, adjacent two first electrode blocks in a same first electrode are connected through two connecting pieces.

When adjacent two first electrode blocks in a same first electrode are connected through two connecting pieces, the first electrode block may be electrically connected to two contact portions via one via hole. That is, when performing a patterning process on the insulating layer, each via hole corresponds to two contact portions, so that the area of the via hole is relatively large, and requirements on the process is lowered.

Further, before the step of forming an electrically conductive connecting piece, the method further comprises a step of: forming a black matrix in the non-contact area. The black matrix can prevent light leakage at a periphery of the touch substrate when the touch substrate is used in a touch display apparatus and may block a lead wire formed in the non-touch area.

According to a further aspect of the present invention, there is provided a touch display apparatus, which comprises the above described touch substrate. Because in the touch substrate, a connecting piece may be formed first, and it is only required to form one insulating layer after forming the connecting piece, the structure of the touch substrate is simplified; moreover, on the touch substrate, the first electrode block is electrically connected to the connecting piece via a via hole, which reduces occurrence of rupture caused when the first electrode block climbs at edges of the connecting piece, thereby ensuring quality of the touch substrate. Further, the structure of the touch display apparatus is simplified, while quality of the touch display apparatus is ensured.

It may be understood that the foregoing implementations are only exemplary embodiments adopted for illustrating the principle of the present invention, but, the present invention is not limited thereto. For those skilled in the art, various variations and improvements may be made without departing from the spirit and scope of the present invention, and such variations and improvements are also regarded as the protection scope of the present invention.

The invention claimed is:

1. A touch substrate, comprising a plurality of first electrodes extending along a first direction and a plurality of second electrodes extending along a second direction that intersects with the first direction, wherein the first electrode comprises a plurality of first electrode blocks, the second electrode comprises a plurality of second electrode blocks, adjacent two first electrode blocks are connected through at least one electrically conductive connecting piece, adjacent two second electrode blocks are formed integrally, and an insulating layer is disposed between a layer where the first electrodes and the second electrodes are located and the connecting piece to insulate and separate the second electrodes from the connecting piece; and wherein each connecting piece comprises two contact portions and a connecting portion connected between the two contact portions, the two contact portions are electrically connected to the first electrode blocks at two ends of the connecting portion, respectively; the insulating layer at least covers each connecting piece and exceeds border of the connecting piece, and the first electrode block is electrically connected to the contact portion via a via hole passing through the insulating layer; and wherein each contact portion comprises at least an edge area, and the insulating layer at least covers at least a part of a farthest edge area of each contact portion from the connecting portion along the first direction.

2. The touch substrate according to claim 1, wherein the contact portion comprises a middle area and a plurality of edge areas surrounding the middle area, each edge area includes an edge of the contact portion, and the via hole exposes no more than two edge areas in the plurality of edge areas, so that the number of the edge areas in contact with the first electrode block is less than or equal to two.

3. The touch substrate according to claim 2, wherein the plurality of edge areas include a first edge area, a second edge area, a third edge area, and a fourth edge area, the first edge area is disposed between the middle area and the connecting portion, and the first edge area and any one of the other three edge areas are not exposed by the via hole.

4. The touch substrate according to claim 2, wherein the plurality of edge areas include a first edge area, a second edge area, a third edge area, and a fourth edge area, the first edge area is disposed between the middle area and the connecting portion, and the first edge area and any two of the other three edge areas are not exposed by the via hole.

5. The touch substrate according to claim 2, wherein an orthographic projection of the via hole on the contact portion is in the middle area.

6. The touch substrate according to claim 1, wherein the touch substrate comprises a touch area for touch and a non-touch area surrounding the touch area, and the insulating layer covers the touch area.

7. The touch substrate according to claim 1, wherein a size of the contact portion in the second direction is greater than or equal to that of the connecting portion in the second direction.

8. The touch substrate according to claim 1, wherein material for forming the connecting piece is a metal.

9. The touch substrate according to claim 1, wherein material for forming the insulating layer is a photoresist.

10. The touch substrate according to claim 1, wherein adjacent two first electrode blocks in a same first electrode are connected via two connecting pieces.

11. The touch substrate according to claim 10, wherein the first electrode block is electrically connected to two contact portions via one via hole.

12. A method for manufacturing a touch substrate, comprising steps of:
forming an electrically conductive connecting piece, wherein the connecting piece comprises two contact portions and a connecting portion disposed between the two contact portions;
forming an insulating layer such that the insulating layer at least covers each connecting piece and exceeds border of the connecting piece;
forming a via hole passing through the insulating layer, wherein the via hole is disposed above the contact portion and exposes only a part of edges of the contact portion; and
forming a plurality of first electrodes extending along a first direction and a plurality of second electrodes extending along a second direction, wherein the first direction intersects with the second direction, the first electrode comprises a plurality of first electrode blocks, the second electrode comprises a plurality of second electrode blocks formed integrally, adjacent two first electrode blocks are connected through at least one connecting piece, and the first electrode block is electrically connected to the contact portion via the via hole;

wherein each contact portion comprises at least an edge area, and the insulating layer at least covers at least a part of a farthest edge area of each contact portion from the connecting portion along the first direction.

13. The method according to claim 12, wherein the contact portion comprises a middle area and a plurality of edge areas surrounding the middle area, each of the edge areas includes one edge of the contact portion, and the step of forming a via hole passing through the insulating layer comprises:
performing a patterning process on the insulating layer to remove a part in a predetermined area of the insulating layer to form the via hole, such that the number of the edge areas exposed by the via hole is less than or equal to two.

14. The method according to claim 13, wherein the plurality of edge areas include a first edge area, a second edge area, a third edge area, and a fourth edge area, the first edge area is disposed between the middle area and the connecting portion, and
in the step of performing a patterning process on the insulating layer, the first edge area and any one of the other three edge areas are not exposed by the via hole.

15. The method according to claim 13, wherein the plurality of edge areas include a first edge area, a second edge area, a third edge area, and a fourth edge area, the first edge area is disposed between the middle area and the connecting portion, and
in the step of performing a patterning process on the insulating layer, the first edge area and any two of the other three edge areas are not exposed by the via hole.

16. The method according to claim 13, wherein in the step of performing a patterning process on the insulating layer, an orthographic projection of the predetermined area on the contact portion is in the middle area.

17. The method according to claim 12, wherein the touch substrate comprises a touch area for touch and a non-touch area surrounding the touch area, and in the step of forming an insulating layer, the insulating layer covers the touch area.

18. The method according to any one of claim 12, wherein a size of the contact portion along the second direction is greater than or equal to that of the connecting portion in the second direction.

19. The method according to claim 12, wherein by performing a patterning process on the insulating layer, adjacent two first electrode blocks in a same first electrode are connected through two connecting pieces.

20. A touch display apparatus, comprising the touch substrate according to claim 1.

* * * * *